United States Patent
Broutin et al.

(10) Patent No.: US 6,243,403 B1
(45) Date of Patent: *Jun. 5, 2001

(54) METHOD AND APPARATUS FOR INTEGRATED OPTICAL WAVELENGTH STABILIZATION

(75) Inventors: Scott L. Broutin, Kutztown; James Kevin Plourde, Allentown; George John Przybylek, Douglasville; John William Stayt, Jr., Schnecksville; Frank Stephen Walters, Kutztown, all of PA (US)

(73) Assignee: Agere Systems Optoelectronics Guardian Corp, Miami Lakes, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/228,889

(22) Filed: Jan. 11, 1999

(51) Int. Cl.$^7$ ........................................ H01S 3/13
(52) U.S. Cl. .................. 372/32; 372/32; 372/31; 372/27; 372/34; 372/20; 372/9; 250/205; 250/216
(58) Field of Search ................ 372/32, 31, 29, 372/34, 103, 20, 28, 101, 27, 9; 250/559.1, 205, 216, 227.23

(56) References Cited

U.S. PATENT DOCUMENTS

| | | |
|---|---|---|
| 4,901,306 | 2/1990 | Gardner . |
| 4,912,526 | 3/1990 | Iwaoka et al. . |
| 4,914,662 | 4/1990 | Nakatani et al. . |
| 5,084,884 | 1/1992 | Terada . |
| 5,384,799 | 1/1995 | Osterwalder . |

(List continued on next page.)

OTHER PUBLICATIONS

Tidrow et al., "A high strain two-slack two-color quantum well infrared photodetector", Appl. Phys. Lett. 70(7):859–861, Feb. 1997.

Chen et al., "Two-color corrugated quantum-well infrared photodetector for remote temperature sensing", Appl. Phys. Lett. 72(1):7–9, Jan. 1998.

(List continued on next page.)

Primary Examiner—Frank G. Font
Assistant Examiner—Delma R. Flores Ruiz
(74) Attorney, Agent, or Firm—Duane Morris & Heckscher LLP; Steven E. Koffs

(57) ABSTRACT

A wavelength-stabilized laser system includes a laser that produces a laser light. The laser light has an amplitude and a wavelength that varies with the temperature of the laser and/or a bias signal provided to the laser. A temperature control device controls the temperature of the laser. A first detector outputs a first signal representing an amplitude of a laser light. A filter receives the laser light and outputs a filtered light having an amplitude that varies with the wavelength of the laser light. A second detector outputs a second signal representing the amplitude of the filtered light. An electromagnetic radiation source transmits electromagnetic radiation through the filter and through a diverging lens. A third detector receives the electromagnetic radiation that passes through the diverging lens. The second detector may be between the diverging lens and the third detector. The third detector outputs a third signal representing an amplitude of the electromagnetic radiation. A processor generates and transmits a control signal to control the temperature control device or the bias signal based on the first, second and third signals. A sealed housing contains the laser, the first, second and third detectors, the filter, the diverging lens, and the electromagnetic radiation source. The processor may be within or outside the housing. In a variation of the system, the third detector may be between the diverging lens and the second detector; the third detector has a hole or window through which the laser light passes.

21 Claims, 2 Drawing Sheets

U.S. PATENT DOCUMENTS

| | | |
|---|---|---|
| 5,428,700 | 6/1995 | Hall . |
| 5,764,678 | 6/1998 | Tada . |
| 5,786,915 | 7/1998 | Scobey . |
| 5,832,014 | 11/1998 | Johnson . |

OTHER PUBLICATIONS

1998 Santec Component Series, pp. 1–11.

Wavelength–Selected (D2526G) Laser 2000 Direct Modulated Isolated DFB Laser Module, Lucent Technologies, Bell Labs Innovations, Aug. 1997, pp 1–8.

Wavelength Locker Test Report, JDS Fitel, Dec. 4, 1997, pp. 1–3.

Nortel Networks: Optical Networking/Transport, Nov. 18, 1998, pp. 1–3.

Broadband: Product Portfolio—Utility Networks, Nortel, Nov. 18, 1998, pp. 1–2.

News Letter, 32ch Tunable Laser Light Source System, Nov. 18, 1998, p. 1.

News Letter, Optical Variable Attenuator, OVA–630, Nov. 18, 1998, p. 1.

Components for DWDM Systems, Santec, Laser Focus World, Oct. 1998, p. 70.

US 6,243,403 B1

METHOD AND APPARATUS FOR INTEGRATED OPTICAL WAVELENGTH STABILIZATION

FIELD OF THE INVENTION

The present invention is related to the field of wavelength stabilized laser systems.

DESCRIPTION OF THE RELATED ART

The wavelength stabilized laser is a recently developed component of dense wavelength division multiplexed (DWDM) systems. In a DWDM system, a single semiconductor laser device may be used to provide light at several predetermined wavelengths (each corresponding to a different channel.) Commercial devices have been produced with 100 gigahertz spacing. If it becomes necessary to add further channels to an existing optical fiber, even denser wavelength spacing may be used in the future. As the wavelength spacing decreases, wavelength stabilization takes on a more important role.

U.S. Pat. No. 5,832,014 to Johnson, which is assigned to Lucent Technologies Inc., is incorporated herein by reference in its entirety for its teachings on wavelength stabilization in tunable semiconductor lasers. Johnson describes a tunable semiconductor laser including a gain section and at least one tuning section. Spontaneous emission (SE) from the tuning section is detected and used in a feedback control loop to control the amount of current applied to the tuning section. The feedback control loop operates to maintain the detected SE at a constant level, such that the current applied to the tuning section is adjusted to compensate for the effects of aging and the laser output wavelength is thereby stabilized.

Johnson rejects a number of alternative approaches, stating that, "Conventional approaches to solving the wavelength stabilization problem in tunable semiconductor lasers generally involve monitoring the lasing wavelength using precise filters. . . . However, these filtering techniques can be expensive and difficult to implement in many practical applications. Moreover, the required filters are often unsuitable for integration with the semiconductor laser on a single chip."

A method and an apparatus are desired that make use of filters for wavelength stabilization in semiconductor lasers practical and effective.

SUMMARY OF THE INVENTION

The present invention is an apparatus and method for calibrating a laser assembly, in which an electromagnetic radiation source within the laser housing transmits electromagnetic radiation through the same filter that is used to analyze the laser wavelength.

A first detector monitors an amplitude of a laser light output by the laser. A filter receives the laser light and outputs a filtered light having an amplitude that varies with the wavelength of the laser light. A second detector monitors the amplitude of the filtered light. An electromagnetic radiation source transmits electromagnetic radiation through the filter, through a lens, and onto a third detector. The apparatus is contained inside a sealed housing of the laser.

DETAILED DESCRIPTION

Figure 1:
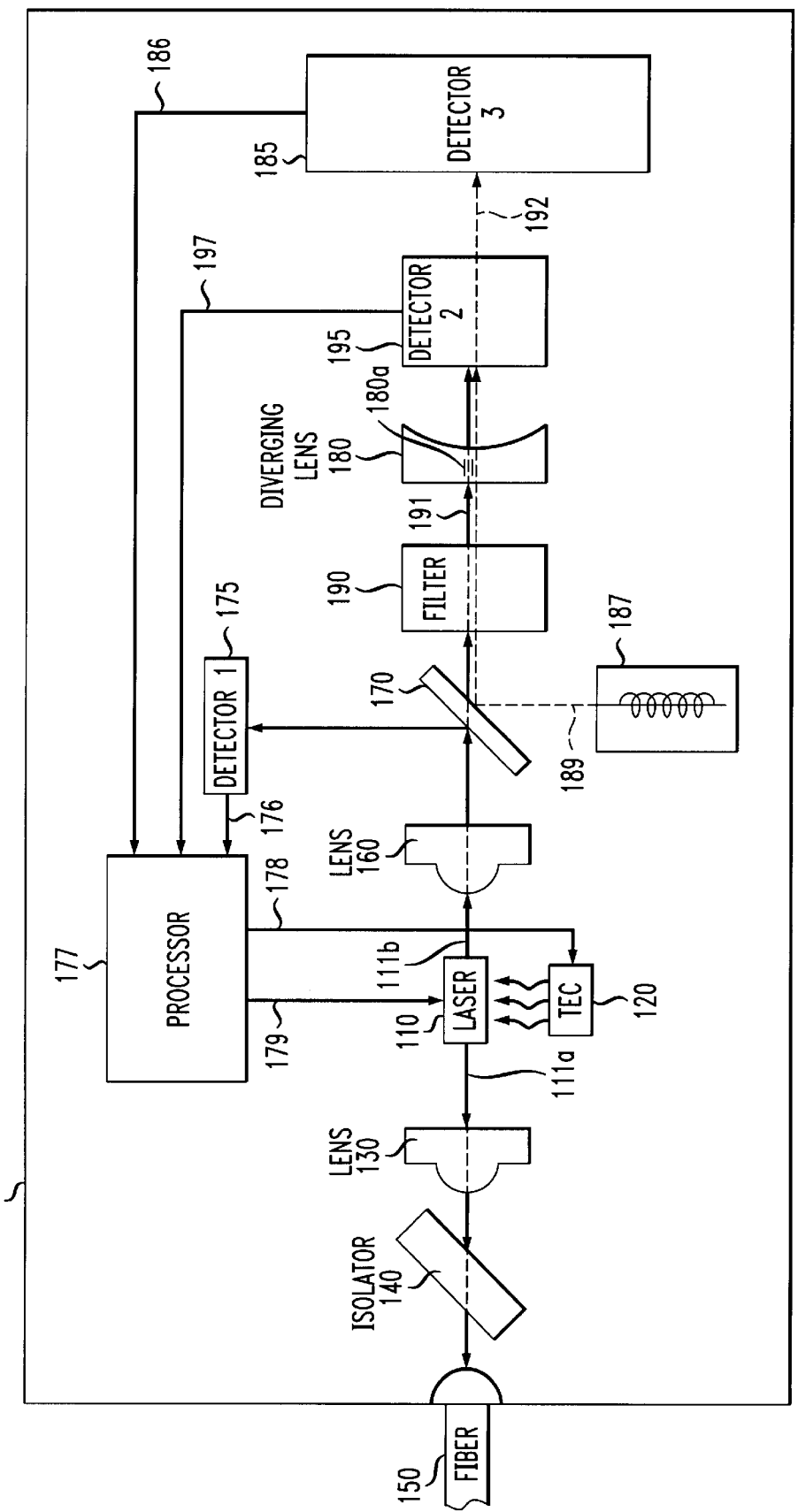
FIG. 1 is a block diagram of a laser system having a calibration apparatus according to the invention.

FIG. 1 shows a first exemplary laser system 100 having a calibration apparatus according to the invention. In the example of FIG. 1, the laser system is packaged and self-contained within a housing 101.

The wavelength stabilized laser system 100 includes a laser 110 that transmits a laser light 111a from the front and a laser light 111b from the backface of laser 110. The laser light 111a is transmitted through a focusing lens 130 and optical isolator 140, to an optical fiber 150. The isolator 140 prevents transmission of light back from the fiber 150 into the laser 110. Isolator 140 may be a conventional isolator providing at least about 30 dB of attenuation. The laser lights 111a and 111b have the same wavelength, so that the properties of laser light 111a are determined and controlled by monitoring light 111b.

To monitor the wavelength of laser light 111b, laser system 100 uses a filter 190, that receives the laser light and outputs a filtered light 191 having an amplitude that varies with the wavelength of the laser light 111b. More specifically, the filter 190 has a gain that is a function of the wavelength of the laser light 111b. The filter may be, for example, a conventional etalon or an edge of crossing filter, band pass filter, low pass filter, high pass filter, or the like.

The filtered light 191 is used to provide feedback that is used to stabilize the frequency of the laser light 111b. More specifically, because the amplitude of the filtered light 191 is a function of the amplitude and wavelength of the laser light 111b, the ratio of the amplitude of the filtered light 191 to the amplitude of the laser light 111b depends on the wavelength. By monitoring the ratio, the wavelength may generally be determined. For some types of filters, a given ratio can only correspond to a single wavelength within the working range of the laser. For other types of filters (e.g., an etalon) several wavelengths may result in the same ratio; other known data may be used to determine which of these wavelengths produced that ratio.

For example, if an etalon is used, and the temperature of the laser is monitored, the wavelength may be approximated based on the temperature, and the actual wavelength is the wavelength which: (1) produces the observed ratio, and (2) lies nearest to the approximated wavelength.

Conventional systems using filters to monitor laser wavelength operate on the assumption that the filter is immune to aging and drift effects. This assumption may be incorrect. If the filter is subject to aging or drift effects, the ratio of the filtered light 191 to the laser light 111b at any given frequency may deviate from the ratio for the same frequency at the time assembly 100 is manufactured. For example, it is possible that the filter may darken, or the transfer function of the filter may change after long periods of exposure to laser light. Further, the position or tilt of the filter may shift within the package (e.g., due to solder creep). A very small change in the orientation of the filter may have a substantial effect on the transfer function of the fitter.

According to the present invention, a method and an apparatus are provided for monitoring the characteristics of the filter 190. An electromagnetic radiation source 187 inside of the housing 101 transmits a calibration beam 189 through the filter 190, to form a filtered calibration beam 192 that reaches a detector 185. Because a known, calibrated radiation source 187 may be used for calibrating filter 190, instead of the laser light 111b, a change in the filtered calibration beam 192 is not confounded with a change in the laser light 111b.

Referring again to FIG. 1, the complete calibration system 100 is described in greater detail below. Laser light 111b has an amplitude and a wavelength that varies as a function of the temperature of the laser 110.

The laser 100 may be a of a conventional type, such as a distributed feedback (DFB) laser, or a distributed Brag reflector (DBR) laser, or the like. The wavelength of the laser light 111b generated by these laser types is a function of the temperature of the laser 100. (The wavelength of a DBR laser is a function of both the temperature and a bias signal that is provided to the Brag reflector section of the DBR laser.) Thus, temperature adjustments may be used to adjust the wavelength of either a DFB or DBR laser.

In the exemplary embodiments, a temperature control device (which may be, for example, a thermoelectric cooler (TEC) 120), is thermally coupled to the laser 110 to control the temperature of the laser. The TEC 120 may be abutting or near to the laser, as shown in FIG. 1, or may be mounted outside of the housing 101 (not shown). Because the entire package may be quite small, it is possible to have a high thermal conductance between the laser 110 and the TEC 120, even if the TEC 120 is not abutting the laser 110. The TEC 120 allows heating and cooling of the laser 110. Alternative heating devices may include a resistance heater (not shown).

A focussing lens 160 focuses the laser light 111b. A beam splitter 170 deflects a portion of the laser light 111b onto a first detector 175. Detector 175 may be, for example, a conventional P-I-N (p-intrinisic-n) diode, which may be, for example, an InGaAs, InP, or InAs type diode. Other suitable photodetectors may be used. The first detector 175 receives the portion of the laser light 111b from the beam splitter 170 and provides a first signal 176 representing the amplitude of the laser light 111b. The beamsplitter 170 has a back surface that reflects substantially all of the calibration beam 189.

The remainder of the laser light 111b that is not deflected by beamsplitter 170 is transmitted through beamsplitter 170 and a filter 190, to form a filtered light 191. Filtered light 191 passes through a diverging lens 180 to a second detector 195. The diameter of the laser light 111b and the distance between the diverging lens and the second detector 195 are sufficiently small that substantially all of the filtered light 191 impinges on the second detector. The diverging lens 180 may have a small hole or flat window 180a through its center which permits filtered light 191 to pass through and remain focussed to reach detector 195. The second detector 195, which may also be a P-I-N diode (or other suitable photodetector), receives the filtered light 191 and provides a second signal 197 representing the amplitude of the filtered light 191. As described above, during normal operation of the laser 110, the ratio of amplitude of the filtered light 191 to the amplitude of the laser light 111b is determined based on the output signals 176 and 197 of the two diodes 175 and 195, respectively.

According to the invention, an electromagnetic radiation source 187 inside the sealed housing 101 of the assembly 100 transmits electromagnetic radiation 189 through the filter 190, to form filtered electromagnetic radiation 192. Filtered electromagnetic radiation 192 passes through the lens 180, and onto a third detector 185.

The second detector 195 may be substantially transparent in the band of the electromagnetic radiation 189. Alternatively, most of the electromagnetic radiation may be diverged sufficiently so as to impinge on the third detector 185 without being significantly shadowed by the second detector 195 (The filtered electromagnetic beam 192 can have a larger cross section or diameter than the filtered light 191; the outer portion of the filtered electromagnetic radiation 192 diverges more than the center and only a small percentage of beam 192 falls onto the second detector 195.) Although filtered electromagnetic radiation beam 192 is shown schematically by an arrow (→), one of ordinary skill understands that the beam 192 may have a substantial fan out after passing through the diverging lens 180, and may subtend a substantial solid angle. In any event, not more than an insubstantial portion of the electromagnetic radiation 189 is absorbed by the second detector 195.

The electromagnetic radiation source 187 may be, for example, a light emitting diode (LED). Preferably, a long wavelength LED is only used as the radiation source 187 if filter 190 is a pure optical filter (as opposed to the etalon). Other types of radiation sources are preferred when filter 190 is an etalon. Alternatively, a laser diode may also be used as a radiation source 187. As a further alternative, the eletromagnetic radiation source 187 may be a device that acts approximately as a blackbody emitter. A blackbody emitter emits electromagnetic radiation having an intensity that is proportional to the fourth power of the absolute temperature of the surface of the blackbody emitter. A heater (which may be a simple resistance heater) having a surface with a high emissivity can approximate a blackbody emitter. Conventional black thermal control paints may be used to provide a high emissivity surface.

Alternatively, the electromagnetic radiation source 187 may be a multi-colored laser source. The various colors of the multicolored laser light may be separated with a prism (not shown) before reaching the third detector 185.

The third detector 185 may be a single detector or an array of detectors (or cells) arranged approximately in a ring or polygon around the periphery of item 185. The third detector 185 is of a type that detects electromagnetic radiation in the band of the radiation 189 from electromagnetic radiation source 187. For example, if the radiation 189 is blackbody thermal radiation, a thermal detector is used. If radiation 189 is infrared (IR) light, then detector 185 is an IR detector (or array of IR detectors). The third detector 185 generates and outputs a third electrical signal 186 that varies with the intensity of the filtered electromagnetic radiation 192.

The practice of the invention is not limited to communications laser systems. If the radiation 189 is multicolor light, third detector 185 may include a system such as the Quantum-well infrared photodetector (QWIP) or corrugated QWIP described in "Two-Color Corrugated Quantum-Well Infrared Photodetector for Remote Temperature Sensing," by C. J. Chen et al., Appl. Phys. Lett. 72 (1), Jan. 5, 1998, which is incorporated by reference herein in its entirety. QWIP detectors are usable for long wavelength lasers that are cryogenically operated. QWIP detectors are operated at liquid Nitrogen temperatures (about 77 Kelvin) as are some long wavelength lasers in the wavelength band beyond typical communications lasers (i.e. greater than 1600 nanometers). These cryogenic lasers may be used for chemical analysis and other photo-spectra apparatus.

If the third detector 185 includes a plurality of detectors (cells), then a simple combiner network (not shown) adds the current contributions from each individual cell.

To ensure that the filtered electromagnetic radiation 192 is transmitted to the third detector 185, the housing 191 is evacuated or filled with a medium having a low thermal conductance and a low absorptance for the electromagnetic radiation 189.

One of ordinary skill recognizes that the electromagnetic radiation may raise the temperature within the housing 101, which could affect the temperature of laser 110. Two exemplary solutions to this problem are: (1) the blackbody emitter may pulsed with a low duty cycle, so as to reduce heating of the apparatus; or (2) the third detector 185 may be a high sensitivity device, so that an electromagnetic energy source 187 emitting low intensity radiation may be used, Both of these two solutions may also be practiced simultaneously. One of ordinary skill in the art of circuit design can readily include the components to pulse the electromagnetic radiation source 187.

FIG. 1 shows a processor 177 which receives the first, second and third electrical signals 176, 197 and 186 of the respective detectors 175, 195 and 185. One of ordinary skill in the art understands that the electrical output signals 176, 197 and 186 may be electrically filtered and amplified, and may be converted from analog to digital format, before being transmitted to processor 177. Processor 177 generates and transmits (to TEC 120) a control signal 178 based on the first, second and third control signals 175, 195 and 185. TEC 120 adjusts the temperature of the laser 110 to regulate the laser wavelength. If laser 110 is a DBR laser, processor 177 also generates and transmits (to laser 110) a bias signal for controlling the wavelength of the laser.

Processor 177 may be a microprocessor or microcontroller, or an application specific integrated circuit (ASIC). Processor 177 feeds back a control signal 178 to the TEC 120, and in the case of a DBR laser, may also adjust the bias signal provided to the laser, based on the signals 176 and 197. In a variation of the exemplary embodiment, the processor may be external to the housing 101, and may be, for example, the processor of a general purpose computer.

The exemplary assembly 100 of FIG. 1 includes a hermetically sealed housing 101 containing the laser 110, the TEC 120, the first, second and third detectors 175, 195, and 186, the lenses 130, 160, and 180, the electromagnetic radiation source 187, the isolator 140, the beamsplitter 170, the filter 190, and the processor 177. One of ordinary skill recognizes that the processor may be located inside or outside of the housing 101.

In a variation of the embodiment of FIG. 1, The second detector 195 and third detector 185 may be integrated into a single device and do not need to be physically separated. If the wavelengths of the laser 110 and the electromagnetic source 187 are similar, the function of third detector 185 may be performed by second detector 195 and the third detector 185 is not required.

Thus, in this variation, the apparatus for calibrating the laser 110 may include: a first detector 175 for monitoring the amplitude of the laser light 111b output by the laser 110; a filter 190 that receives the laser light 111b and outputs a filtered light 191 having an amplitude that varies with the wavelength of the laser light 111b; a second detector 195 for monitoring the amplitude of the filtered light 111b; a lens 180; and an electromagnetic radiation source 187 that transmits electromagnetic radiation 189 through the filter 190, through the lens 180, and onto the second detector 195 independently of the filtered light 191, wherein the second detector 195 is capable of detecting the electromagnetic radiation 189, and wherein the apparatus 100 is contained inside a sealed housing 101 of the laser 110.

Figure 2:
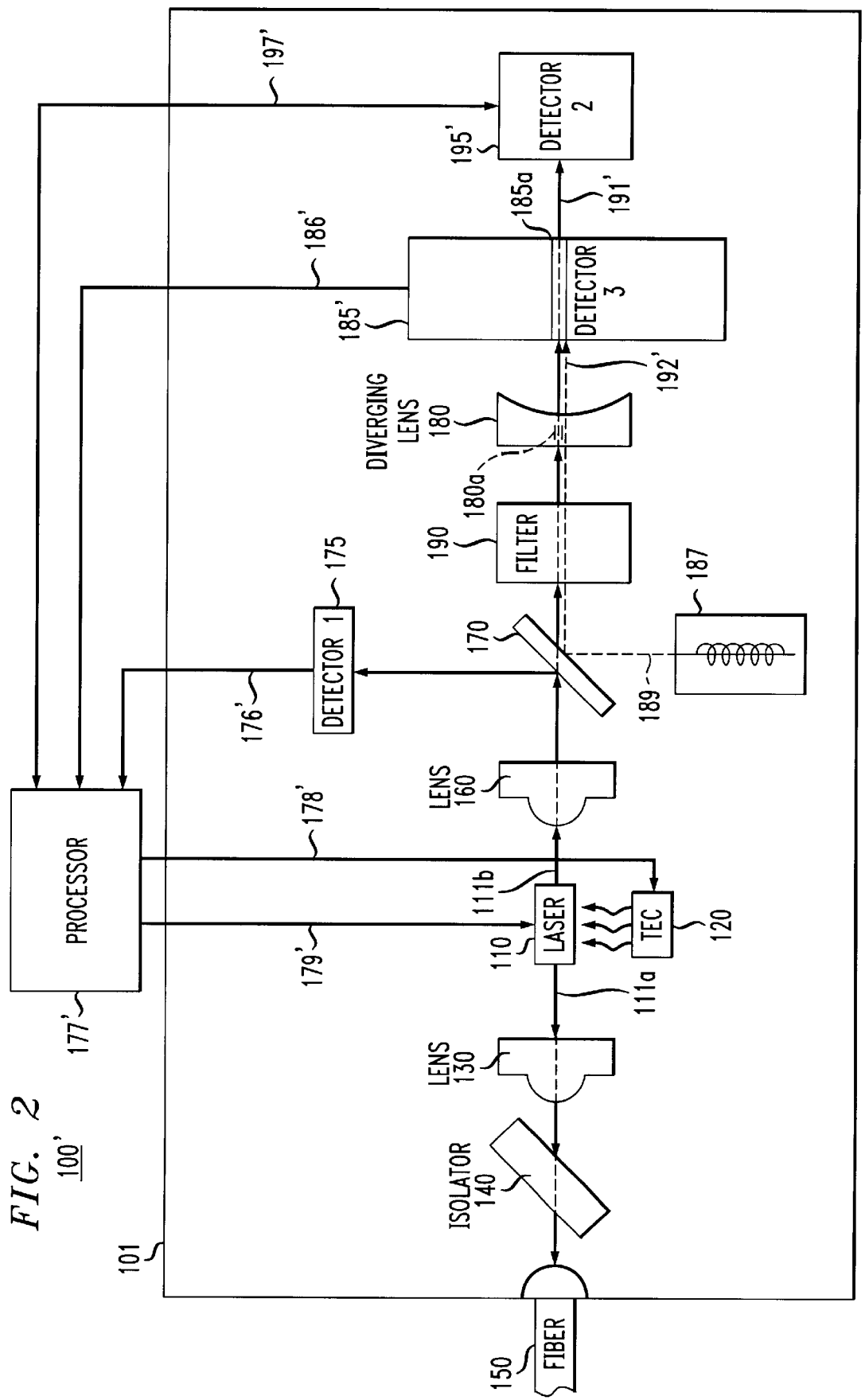
FIG. 2 is a block diagram of a variation of the exemplary embodiment.

FIG. 2 shows a second exemplary embodiment of the invention. In FIG. 2, items that are identical to the items in FIG. 1 have the same reference numerals, and are not described again in detail. Items which differ from those shown in FIG. 1 are indicated by the prime (') designation.

In FIG. 2, the positions of the second and third detectors 195' and 185' are reversed from the positions of detectors 195 and 185 in FIG. 1. The third detector 185' is sufficiently large to include item 185a. Item 185a may either be a small hole (that is large enough to allow the filtered laser light 191' to pass through third detector 185'), or a window that is transparent to radiation in the band of radiation 191'. The light which passes through item 185a impinges on second detector 195'. Meanwhile, as in the embodiment of FIG. 1, the filtered electromagnetic radiation 192' may have a substantial fan out after emerging from the diverging lens 180', so that most or substantially all of the filtered electromagnetic radiation 192' impinges on the third detector 185'.

FIG. 2 also shows an example of a processor 177' that is outside of the housing 101 of assembly 100'. Signals 176' from detector 175, signal 197' from detector 195', and signal 186' from detector 185' convey the same information as the respective signals 176, 197 and 186 described above with reference to FIG. 1. Similarly, the signals 178' and 179' generated by processor 177' convey the same information as signals 178 and 179 described above with reference to FIG. 1. Two factors considered in determining whether to include the processor within the housing 101 include space limitations and thermal control considerations.

By monitoring the characteristics of the filter 190, one of ordinary skill in the art could readily update the constants used to process the second electrical signal 197 (or 197') generated by the second detector 195 (or 195'), so that the wavelength of laser light 111b is still accurately determined, even if the characteristics of filter 190 change. These changes may be implemented within processor 177 (or 177').

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. Apparatus for calibrating a laser, comprising:
   a first detector for monitoring an amplitude of a laser light output by the laser;
   a filter that receives the laser light and outputs a filtered light having an amplitude that varies with the wavelength of the laser light;
   a second detector for monitoring the amplitude of the filtered light;
   a lens;
   a third detector; and
   an electromagnetic radiation source that transmits electromagnetic radiation through the filter, through the lens, and onto the third detector, wherein the apparatus is contained inside a sealed housing of the laser.

2. The apparatus of claim 1, wherein not more than an insubstantial portion of the electromagnetic radiation is absorbed by the second detector.

3. The apparatus of claim 2, wherein the housing is evacuated or filled with a medium having a low thermal conductance and a low absorptance for the electromagnetic radiation.

4. The apparatus of claim 1, wherein the electromagnetic radiation source is a light emitting diode.

5. The apparatus of claim 1, wherein the electromagnetic radiation source acts approximately as a blackbody emitter.

6. The apparatus of claim 5, wherein the blackbody emitter is pulsed, so as to reduce heating of the apparatus.

7. The apparatus of claim 1, wherein the laser light passes through the lens substantially without diverging, and impinges on the second detector.

8. The apparatus of claim 7, wherein the electromagnetic radiation diverges in the lens, so that substantially all of the electromagnetic radiation impinges on the third detector, and an insubstantial portion of the electromagnetic radiation is absorbed by the second detector.

9. The apparatus of claim 1, wherein the third detector has a hole or a region that is transparent to the filtered light, so that the electromagnetic radiation is absorbed by the third detector, but the filtered light passes through the hole or the transparent region and impinges on the second detector.

10. The apparatus of claim 1, further comprising a processor that generates and transmits a control signal to control the laser based on the first, second and third signals.

11. The apparatus of claim 1, wherein the processor is inside the housing.

12. The apparatus of claim 1, wherein the processor is outside the housing.

13. A wavelength-stabilized laser system, comprising:
- a laser that produces a laser light having an amplitude and a wavelength that varies as a function of a temperature of the laser or a bias signal provided to the laser;
- a temperature control device that controls the temperature of the laser;
- a first detector that outputs a first signal representing an amplitude of a laser light output by the laser;
- a filter that receives the laser light and outputs a filtered light having an amplitude that varies with the wavelength of the laser light;
- a second detector that outputs a second signal representing the amplitude of the filtered light;
- a lens;
- an electromagnetic radiation source that transmits electromagnetic radiation through the filter and through the lens;
- a third detector for receiving the electromagnetic radiation that passes through the lens, the third detector outputting a third signal representing an amplitude of the electromagnetic radiation;
- a sealed housing containing the laser, the first, second and third detectors, the filter, the lens, and the electromagnetic radiation source; and
- a processor that generates and transmits a control signal to control the temperature control device or the bias signal based on the first, second and third signals.

14. Apparatus according to claim 13, wherein the processor is a microprocessor or a microcontroller.

15. Apparatus for calibrating a laser, comprising:
- a first detector for monitoring an amplitude of a laser light output by the laser;
- a filter that receives the laser light and outputs a filtered light having an amplitude that varies with the wavelength of the laser light;
- a second detector for monitoring the amplitude of the filtered light;
- a lens;
- an electromagnetic radiation source that transmits electromagnetic radiation through the filter, through the lens, and onto the second detector independently of the filtered light, the second detector being capable of detecting the electromagnetic radiation, wherein the apparatus is contained inside a sealed housing of the laser.

16. A method for calibrating a laser, comprising:
- monitoring an amplitude of a laser light output by the laser;
- filtering the laser light in a filter and outputting a filtered light having an amplitude that varies with the wavelength of the laser light;
- monitoring the amplitude of the filtered light;
- transmitting electromagnetic radiation through the filter from an electromagnetic radiation source within a housing of the laser; and
- monitoring the electromagnetic radiation transmitted through the filter to determine whether a light transmission characteristic of the filter has changed.

17. The method of claim 16, wherein the housing of the laser is sealed.

18. The method of claim 17, wherein the housing is evacuated or filled with a medium having a low thermal conductance and a low absorptance for the electromagnetic medium.

19. The method of claim 16, wherein the electromagnetic radiation source acts substantially as a blackbody emitter, the method further comprising pulsing the electromagnetic radiation source, so as to reduce heating of the apparatus.

20. The method of claim 16, further comprising:
- directing a first portion of the laser light onto a first detector
- passing a second portion the laser light through a lens and onto a second detector, substantially without diverging the laser light; and
- diverging the electromagnetic radiation in the lens, so that substantially all of the electromagnetic radiation impinges on a third detector.

21. The method of claim 16, further comprising:
- directing a first portion of the laser light onto a first detector;
- passing a second portion the laser light through a diverging lens, through a hole in the third detector, and onto a second detector; and
- passing the electromagnetic radiation through the diverging lens and onto the third detector.

* * * * *